United States Patent
Kato et al.

(10) Patent No.: US 9,743,487 B2
(45) Date of Patent: Aug. 22, 2017

(54) DISPLAY APPARATUS AND METHOD OF EVALUATING VISIBILITY THEREOF

(71) Applicants: Takeshi Kato, Yongin (KR); Geun-Young Jeong, Yongin (KR); Ji-Yeon Yang, Yongin (KR); Byung-Hyun Kim, Yongin (KR)

(72) Inventors: Takeshi Kato, Yongin (KR); Geun-Young Jeong, Yongin (KR); Ji-Yeon Yang, Yongin (KR); Byung-Hyun Kim, Yongin (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 714 days.

(21) Appl. No.: 13/756,723

(22) Filed: Feb. 1, 2013

(65) Prior Publication Data
US 2014/0097760 A1  Apr. 10, 2014

(30) Foreign Application Priority Data
Oct. 5, 2012  (KR) .................. 10-2012-0110688

(51) Int. Cl.
*H05B 37/02* (2006.01)
*H05B 33/08* (2006.01)

(52) U.S. Cl.
CPC ......... *H05B 37/02* (2013.01); *H05B 33/0803* (2013.01)

(58) Field of Classification Search
USPC ....................................................... 315/192
See application file for complete search history.

(56) References Cited

U.S. PATENT DOCUMENTS

| | | | | |
|---|---|---|---|---|
| 6,750,875 B1* | 6/2004 | Keely, Jr. | ............. | G09G 3/2003 345/55 |
| 7,825,921 B2* | 11/2010 | Han | ............. | G09G 5/006 345/213 |
| 2006/0017844 A1* | 1/2006 | Iwaki | ............. | G09G 5/363 348/445 |
| 2006/0158466 A1 | 7/2006 | Chien et al. | | |
| 2007/0269126 A1* | 11/2007 | Choe | ............. | G09G 5/02 382/254 |
| 2011/0051239 A1* | 3/2011 | Daiku | ............. | G02B 27/0093 359/464 |
| 2011/0285753 A1* | 11/2011 | Park | ............. | G09G 3/2003 345/690 |
| 2012/0032960 A1* | 2/2012 | Kameyama | ............. | H04N 7/17318 345/428 |

FOREIGN PATENT DOCUMENTS

| JP | 2007-324667 A | 12/2007 |
|---|---|---|
| JP | 2008-500563 A | 1/2008 |
| KR | 10 2006-0134699 A | 12/2006 |

* cited by examiner

*Primary Examiner* — Lincoln Donovan
*Assistant Examiner* — Patrick Chen
(74) *Attorney, Agent, or Firm* — Lee & Morse, P.C.

(57) ABSTRACT

A method of evaluating visibility of a plurality of sub-pixel structures in a panel having a plurality of red sub-pixels, green sub-pixels, and blue sub-pixels arranged in stripes, the method including establishing a target sub-pixel structure different from the stripe sub-pixel structure of the panel by combining the plurality of pixels, and evaluating a displayed image by using the target sub-pixel structure.

18 Claims, 10 Drawing Sheets

DISPLAY APPARATUS AND METHOD OF EVALUATING VISIBILITY THEREOF

CROSS-REFERENCE TO RELATED PATENT APPLICATION

This application claims the benefit of Korean Patent Application No. 10-2012-0110688, filed on Oct. 5, 2012, in the Korean Intellectual Property Office, the disclosure of which is incorporated herein in its entirety by reference.

BACKGROUND OF THE INVENTION

1. Field of the Invention

Example embodiments relate to a display apparatus and a method of evaluating visibility of the display apparatus.

2. Description of the Related Art

A flat display apparatus, such as an organic light-emitting display apparatus or a liquid crystal display apparatus, includes a panel with red sub-pixels, green sub-pixels, and blue sub-pixels, which are arranged in a matrix form. In this case, with regard to a full-color display apparatus including a pixel formed by sub-pixels of three different emitting colors, a simplest method of arranging sub-pixels for emitting red light, green light, and blue light is a method of uniformly arranging the sub-pixels in rows and columns in a stripe pattern. In a sub-pixel structure in which sub-pixels are arranged in stripes, a gate line and a source line are perpendicular to each other, and thus, it is simple to layout wirings.

SUMMARY OF THE INVENTION

Example embodiments provide a method of evaluating the visibility of various new sub-pixel structures in a panel of a RGB stripe sub-pixel structure.

According to an aspect of the example embodiments, there is provided a method of evaluating visibility of a plurality of sub-pixel structures in a panel having a plurality of red sub-pixels, green sub-pixels, and blue sub-pixels arranged in a stripe pattern, the method including establishing a target sub-pixel structure different from the stripe sub-pixel structure of the panel by combining the plurality of pixels, and evaluating a displayed image by using the target sub-pixel structure.

Displaying the image may include displaying one color for each respective pixel by lighting up one sub-pixel among the red sub-pixel, the green sub-pixel, and the blue sub-pixel of a single pixel.

Establishing the target sub-pixel structure may include defining one pixel of the target sub-pixel structure by combining N×N (where N is a natural number) pixels of the stripe sub-pixel structure.

The target sub-pixel structure may be a pentile sub-pixel structure.

The target sub-pixel structure may include a first pseudo pixel having two first pixels and two second pixels, each first pixel having a red sub-pixel lit up, and each second pixel having a green sub-pixel lit up, and a second pseudo pixel having two third pixels and two second pixels, each third pixel having a blue sub-pixel lit up, and each second pixel having a green sub-pixel lit up.

The target sub-pixel structure may include a first pseudo pixel having one first pixel and one second pixel arranged diagonally, the first pixel having a red sub-pixel lit up, and the second pixel having a green sub-pixel lit up, and a second pseudo pixel having one third pixel and one second pixel arranged diagonally, the third pixel having a blue sub-pixel lit up, and the second pixel having a green sub-pixel lit up.

The target sub-pixel structure may include a first pseudo pixel having six first pixels and three second pixels, each first pixel having a red sub-pixel lit, and each second pixel having a green sub-pixel lit, and a second pseudo pixel having six third pixels and three second pixels, each third pixel having a blue sub-pixel lit, and each second pixel having a green sub-pixel lit.

The target sub-pixel structure may include a first pseudo pixel having four first pixels and one second pixel, each first pixel having a red sub-pixel lit, and each second pixel having a green sub-pixel lit up and arranged diagonally with respect to each of the four first pixels, and a second pseudo pixel having four third pixels and one second pixel, each third pixel having a blue sub-pixel lit up, and each second pixel having a green sub-pixel lit up and diagonally arranged with respect to the third pixels.

The target sub-pixel structure may include a first pseudo pixel having eight first pixels and eight second pixels, each first pixel having a red sub-pixel lit up, and each second pixel having a green sub-pixel lit up, and a second pseudo pixel having eight third pixels and eight second pixels, each third pixel having a blue sub-pixel lit up, and each second pixel having a green sub-pixel lit up.

The target sub-pixel structure may include a first pseudo pixel having four first pixels two second pixels, each first pixels having a red sub-pixel lit up, and each second pixel having a green sub-pixel lit up and arranged diagonally with respect to the first pixel, and a second pseudo pixel having four third pixels and two second pixels, each third pixel having a blue sub-pixel lit up, and each second pixel having a green sub-pixel lit up and arranged diagonally to each of the third pixels, wherein the two second pixels are diagonally adjacent to each other.

The target sub-pixel structure may be a hexagon sub-pixel structure.

The target sub-pixel structure may include a first pseudo pixel having a triangular structure and including twelve first pixels and twelve third pixels, each first pixel having a red sub-pixel lit up, and each third pixel having a blue sub-pixel lit up, and a second pseudo pixel having an inverted triangular structure relative to the first pseudo pixel.

The method may further include setting a brightness for displaying white color for respective pixels included in a single pixel of the target sub-pixel structure, the brightness being a value obtained by gamma-correcting and brightness-correcting image data.

According to an aspect of the example embodiments, there is provided a display apparatus, including a panel configured to display an image, the panel including a stripe sub-pixel structure having a plurality of red sub-pixels, green sub-pixels, and blue sub-pixels arranged in a stripe pattern, a pixel establisher configured to establish a target sub-pixel structure different from the stripe sub-pixel structure of the panel, the panel being configured to display a pseudo image based on the target sub-pixel structure, and an evaluator configured to evaluate the pseudo image.

The panel may be configured to display the image by lighting one sub-pixel among the red sub-pixel, the green sub-pixel, and the blue sub-pixel of a single pixel, to display one color.

The pixel establisher may be configured to define one pixel of the target sub-pixel structure, the one pixel having N×N (where N is a natural number) pixels of the stripe sub-pixel structure.

The target sub-pixel structure may be a pentile sub-pixel structure.

The target sub-pixel structure may be a hexagonal sub-pixel structure.

The pixel establisher maybe configured to set brightness for displaying white color for respective pixels included in a single pixel of the target sub-pixel structure, the brightness being a value obtained by gamma-correcting and brightness-correcting image data.

BRIEF DESCRIPTION OF THE DRAWINGS

The above and other features and advantages will become more apparent by describing in detail exemplary embodiments with reference to the attached drawings, in which.

DETAILED DESCRIPTION OF THE INVENTION

Figure 1:
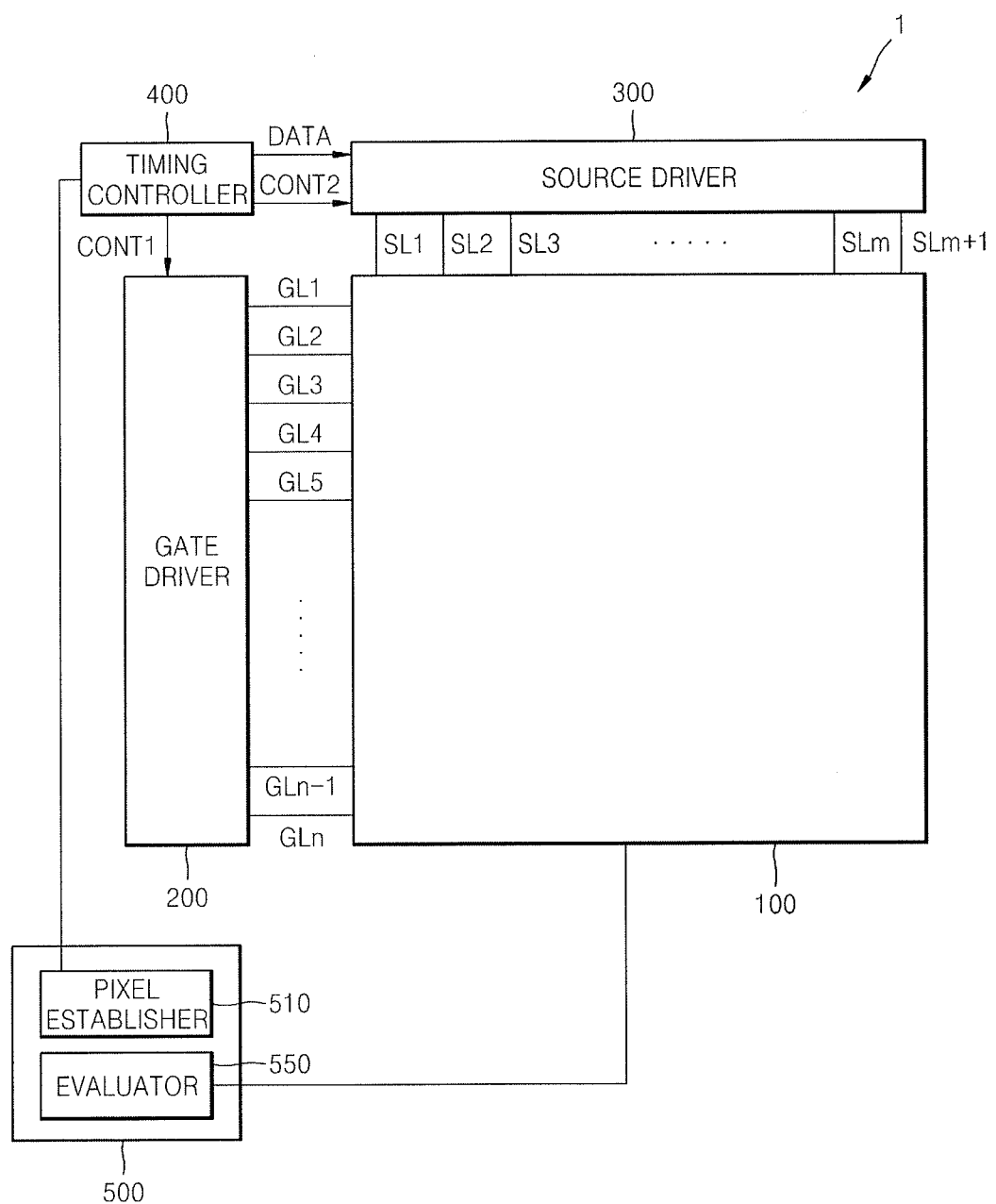
FIG. 1 is a schematic diagram of a display apparatus according to an embodiment.

As the invention allows for various changes and numerous embodiments, particular embodiments will be illustrated in the drawings and described in detail in the written description. However, this is not intended to limit the example embodiments to particular modes of practice, and it is to be appreciated that all changes, equivalents, and substitutes that do not depart from the spirit and technical scope of the example embodiments are encompassed in the example embodiments. In the description of the example embodiments, certain detailed explanations of related art are omitted when it is deemed that they may unnecessarily obscure the essence of the invention.

Terms such as "first" and "second" are used herein merely to describe a variety of constituent elements, but the constituent elements are not limited by the terms. The terms are used only for the purpose of distinguishing one constituent element from another constituent element.

The terms used in the present specification are used for explaining a specific exemplary embodiment, not limiting the present inventive concept. Thus, the expression of singularity in the present specification includes the expression of plurality unless clearly specified otherwise in context. Also, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof Hereinafter, example embodiments will be described in detail with reference to the attached drawings.

Figure 2:
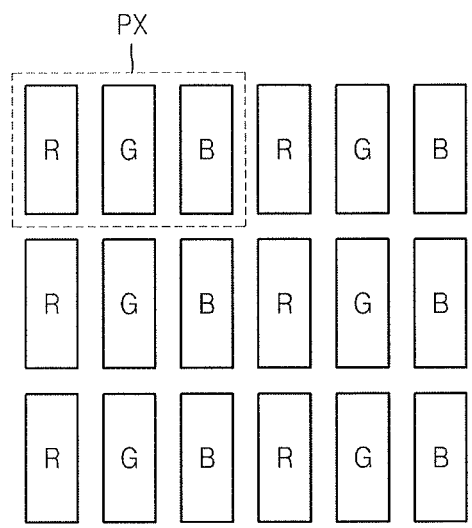
FIG. 2 is a schematic diagram of a pixel structure according to an embodiment.

FIG. 1 is a schematic diagram of a display apparatus 1 according to an embodiment. FIG. 2 is a schematic diagram of a pixel structure according to an embodiment.

Referring to FIG. 1, the display apparatus 1 includes a panel 100, a gate driver 200, a source driver 300, a timing controller 400, and a visibility evaluator 500.

Gate lines GL1 through GLn that are uniformly spaced apart from each other in rows and source lines SL1 through SLm that are uniformly spaced apart from each other in columns may be arranged in a matrix form. Sub-pixel regions are defined by the gate lines GL1 through GLn and the source lines SL1 through SLm. The panel 100 is configured in such a way that red sub-pixels R, green sub-pixels G, and blue sub-pixels B may be repeatedly arranged in every row, and a sub-pixel structure (hereinafter, referred to as a 'stripe sub-pixel structure') may be formed in stripes.

In detail, referring to FIG. 2, three sub-pixels, i.e., a red sub-pixel R, a green sub-pixel G, and a blue sub-pixel B, which are adjacent to each other, are defined as a pixel PX. In addition, sub-pixels are arranged in a matrix form, where the sub-pixels are arranged in every row in a row direction, i.e., a direction along a gate line for selecting a row, and in every column in a column direction, i.e., a direction perpendicular to the gate line.

The gate driver 200 may generate gate signals having combinations of a gate-on voltage at an active level and a gate-off voltage at an inactive level. The gate driver 200 may sequentially supply the gate signals to the panel 100 through the gate lines GL1 through GLn.

The source driver 300 may sequentially supply data signals to the panel 100 through the source lines SL1 through SLm. The source driver 300 converts input image data DATA having a gray level input from the timing controller 400 into a data signal having a voltage or current form.

The timing controller 400 generates a gate control signal CONT1 and a data control signal CONT2, and transmits the gate control signal CONT1 and the data control signal CONT2 to the gate driver 200 and the source driver 300, respectively. The timing controller 400 may sequentially apply gate-on voltages to the gate lines GL1 through GLn and may apply the data signals to respective pixels, such that the panel 100 may display a frame image.

The visibility evaluator 500 displays an image by establishing, e.g., defining, various sub-pixel structures (hereinafter, referred to as 'target sub-pixel structures'), as well as a stripe sub-pixel structure, in a RGB stripe sub-pixel structure. Further, the visibility evaluator 500 evaluates the visibility of the established target sub-pixel structure.

Recently, sub-pixel structures, e.g., other than a stripe sub-pixel structure, have been used to increase pseudo resolution and to reduce power consumption. However, in order to check the visibility of figures and characters in a display apparatus having the non-stripe sub-pixel structures, the display apparatus needs to be manufactured before such checking can be performed. Further, it is not easy to manufacture a display apparatus having the non-stripe sub-pixel structure.

According to the present embodiment, however, the RGB stripe sub-pixel structure may include a target sub-pixel structure, which is configured to pseudo display, e.g., simulate, an image corresponding to the target sub-pixel structure without an actual display apparatus. Therefore, the visibility of the image may be evaluated without, e.g., before, manufacturing the display apparatus having the target sub-pixel structure.

In detail, referring to FIG. 1, the visibility evaluator 500 may include a pixel establisher 510 and an evaluator 550. The pixel establisher 510 may establish, e.g., define, the target sub-pixel structure by combining a plurality of pixels, such that the panel 100 may display an image of multiple target sub-pixel structures by using the RGB stripe sub-pixel structure. The evaluator 550 evaluates the image displayed using the target sub-pixel structure. Thus, according to the present embodiment, a display apparatus having the RGB stripe sub-pixel structure may simulate an image by using various sub-pixel structures so as to evaluate the visibility of figures and characters.

Figure 3:
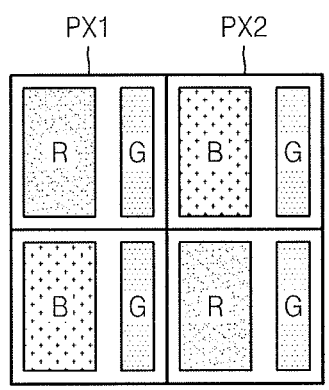
FIGS. 3 through 5 are diagrams of target sub-pixel structures according embodiments.
Figure 4:
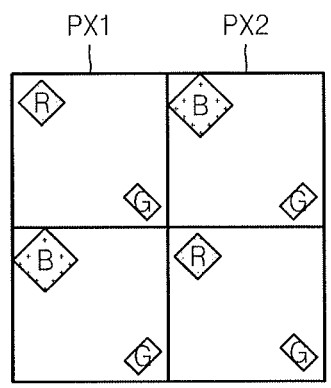
Figure 5:
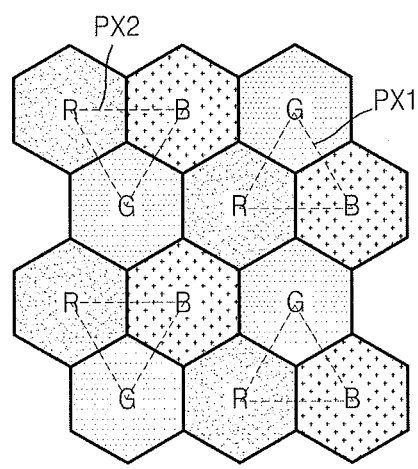

FIGS. 3 through 5 are diagrams of target sub-pixel structures according embodiments.

The sub-pixel structure shown in FIG. 3 is an example of a pentile structure, where a square outline, i.e., a bold line surrounding two sub-pixels, indicates a single pixel PX. Referring to FIG. 3, first pixels PX1 and second pixels PX2 are alternately arranged, such that the pixels of the same type may not be adjacent to each other in horizontal and vertical directions. For example, a first pixel PX1 includes a red sub-pixel R and a green sub-pixel G that are arranged in parallel to each other and to sides of the outlined square, and a second pixel PX2 includes a blue sub-pixel B and a green sub-pixel G that are arranged in parallel to each other and to sides of the outlined square. For example, the first and second pixels PX1 and PX2 may be arranged such that each first pixel PX1 may be adjacent to the second pixel PX2 along each of the vertical and horizontal direction, i.e., respective column and row directions. The green sub-pixel G is thinner than each of the red sub-pixel R and the blue sub-pixel B. Green sub-pixels G are arranged at corresponding positions in pixels that are adjacent to each other in a vertical direction, i.e., the pixels PX are aligned to have the green sub-pixels G of each pixel PX aligned with each other along the vertical direction.

The sub-pixel structure shown in FIG. 4 is another example of a pentile structure, where a square outline indicates a single pixel PX. Referring to FIG. 4, first pixels PX1 and second pixels PX2 are alternately arranged such that pixels of the same type may not be adjacent to each other in horizontal and vertical directions. A first pixel PX1 includes a red sub-pixel R and a green sub-pixel G that are diagonally arranged, i.e., aligned along a diagonal of the outlined square. A second pixel PX2 includes a blue sub-pixel B and a green sub-pixel G that are diagonally arranged, i.e., aligned along a diagonal of the outlined square. The red sub-pixel R is smaller than the blue sub-pixel B. The green sub-pixel G of the first pixel PX1 elongates along the diagonal direction defined by the aligned red and green sub-pixels R and G, and the green sub-pixel G of the second pixel PX2 elongates in a direction perpendicular to the elongation direction of the green sub-pixel in the first pixel PX1.

The sub-pixel structure shown in FIG. 5 is an example of a hexagonal structure. A triangular outline indicated by a dashed line indicates a single pixel PX. Referring to FIG. 5, red sub-pixels R, green sub-pixels G, and blue sub-pixels B may each have a hexagonal shape. In addition, the first pixels PX1 and the second pixels PX2 are alternately arranged such that the pixels of the same type may not be adjacent to each other. A first pixel PX1 includes a red sub-pixel R, a green sub-pixel G, and a blue sub-pixel B, which are arranged in a triangular structure. A second pixel PX2 includes a red sub-pixel R, a green sub-pixel G, and a blue sub-pixel B, which are arranged in an inverted triangular structure relative to the sub-pixel arrangement in the first pixel PX1.

FIGS. 3 through 5 show pentile and the hexagonal sub-pixel structures. However, the example embodiments are not limited thereto. The target sub-pixel structure in FIGS. 3 through 5 may be substituted with other sub-pixel structures.

Figure 6:
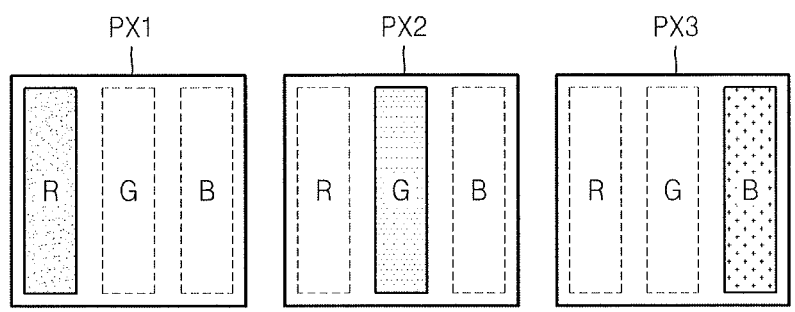
FIGS. 6 and 7 are diagrams of a method of displaying color by a pixel, according to an embodiment.
Figure 7:
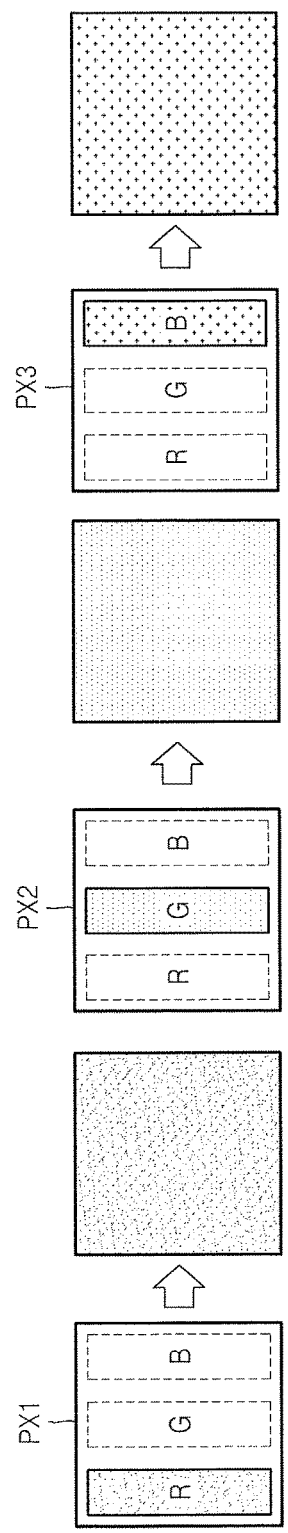

FIGS. 6 and 7 are diagrams for describing a method of displaying color by a pixel, according to an embodiment. It is noted that according to the present embodiment, color displayed by a single pixel PX is determined by lighting up only a single sub-pixel among the red sub-pixel R, the green sub-pixel G, and the blue sub-pixel B of the pixel PX.

As shown in FIG. 6, the first pixel PX1 displays red color by lighting up only the red sub-pixel R among the red sub-pixel R, the green sub-pixel G, and the blue sub-pixel B. Hereinafter, the first pixel PX1, in which only the red sub-pixel R is lit up, is illustrated as a red pixel, as shown in FIG. 7.

As shown in FIG. 6, the second pixel PX2 displays green color by lighting up only the green sub-pixel G among the red sub-pixel R, the green sub-pixel G, and the blue sub-pixel B. Hereinafter, the second pixel PX2, in which only the green sub-pixel G is lit up, is illustrated as a green pixel, as shown in FIG. 7.

As shown in FIG. 6, the second pixel PX3 displays blue color by lighting up only the blue sub-pixel B among the red sub-pixel R, the green sub-pixel G, and the blue sub-pixel B. Hereinafter, the third pixel PX3, in which only the blue sub-pixel B is lit up, is illustrated as a blue pixel, as shown in FIG. 7.

Figure 8:
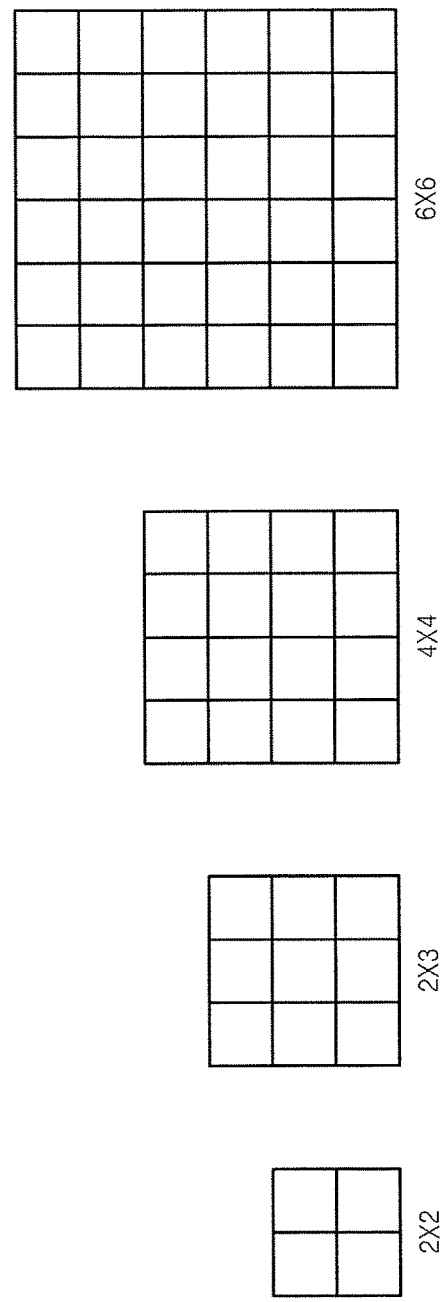
FIG. 8 is a diagram of a method of establishing a target sub-pixel structure, according to an embodiment.

FIG. 8 is a diagram for describing a method of establishing a target sub-pixel structure, according to an embodiment.

Referring to FIG. 8, one pixel having a target sub-pixel structure is established by combining N×N (where N is a natural number) pixels, in which only one sub-pixel having a stripe sub-pixel structure is lit up. For example, the target sub-pixel structure may be established by combining, e.g., 2×2, 3×3, 4×4, or 6×6 pixels.

Figure 9:
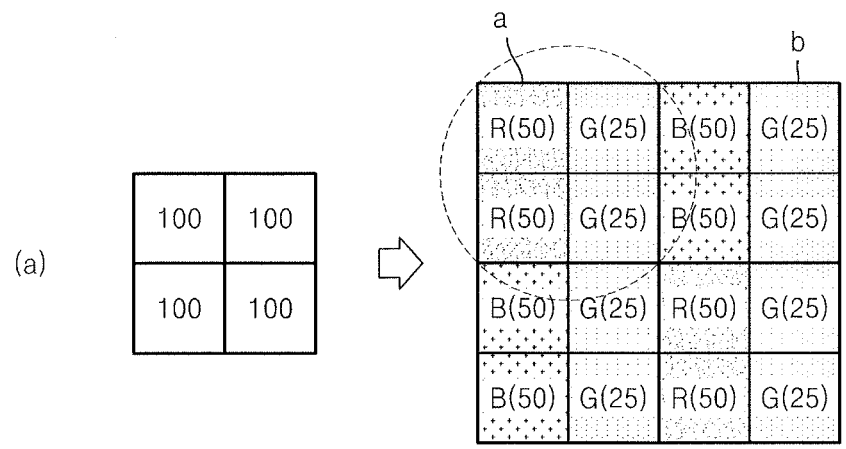
FIG. 9 is a set of diagrams of a method of establishing a target sub-pixel structure in a 2×2 pattern, according to an embodiment.
Figure 9:
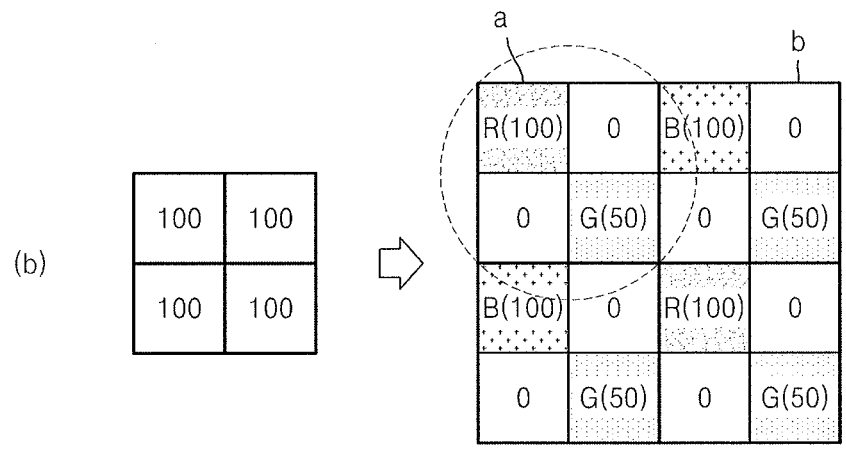

FIG. 9 is a set of diagrams for describing a method of establishing a target sub-pixel structure in a 2×2 pattern, according to an embodiment.

Referring to FIG. 9, the 2×2 pattern indicates one pixel having the target sub-pixel structure by using four pixels having a RGB stripe sub-pixel structure. A square formed by a bold outline defines one pixel having the target sub-pixel structure. A single pixel defined by the thin outline includes three sub-pixels, i.e., the red sub-pixel R, the green sub-pixel G, and the blue sub-pixel B, and displays one color by lighting up only one sub-pixel of the three sub-pixels. Thus, the 2×2 pattern indicates one pixel having the target sub-pixel structure by using four pixels having a RGB stripe sub-pixel structure.

Here, when the brightness of white color is indicated by 100, a number in the square refers to the brightness of a sub-pixel. In addition, the number is a value obtained by setting a gamma value matched with panel properties and gamma-correcting image data to correct brightness.

FIG. 9(a) shows an example of a method of pseudo displaying white color in a 2×2 pattern by establishing a target sub-pixel pixel structure as the pentile sub-pixel structure shown in FIG. 3.

Referring to FIG. 9(a), the target sub-pixel structure is established by combining a first pseudo pixel "a" including two pixels in which the red sub-pixel R is lit up and two pixels in which the green sub-pixel G is lit up, and a second pseudo pixel "b" including two pixels in which the blue sub-pixel B is lit up and two pixels in which the green sub-pixel G is lit up. The brightness of each of the red sub-pixel R and the blue sub-pixels B, which are used to display white color (of which the brightness is 100), is 50 and the brightness of the green sub-pixel G is 25.

FIG. 9(b) shows an example of a method of pseudo displaying white color in a 2×2 pattern by establishing a target sub-pixel pixel structure as the pentile sub-pixel structure shown in FIG. 4.

Referring to FIG. 9(b), the target sub-pixel structure is established by combining the first pseudo pixel "a" including one pixel in which the red sub-pixel R is lit up and one pixel in which the green sub-pixel G is lit up, and the second pseudo pixel "b" including one pixel in which the blue sub-pixel B is lit up and one pixel in which the green sub-pixel G is lit up. The two pixels of the first pseudo pixel "a" diagonally face each other. The two pixels of the second pseudo pixel "b" diagonally face each other. The brightness of each of the red sub-pixel R and the blue sub-pixels B, which are used to display white color (of which the brightness is 100), is 100 and the brightness of the green sub-pixel G is 50. The brightness of the other pixels is 0.

Figure 10:
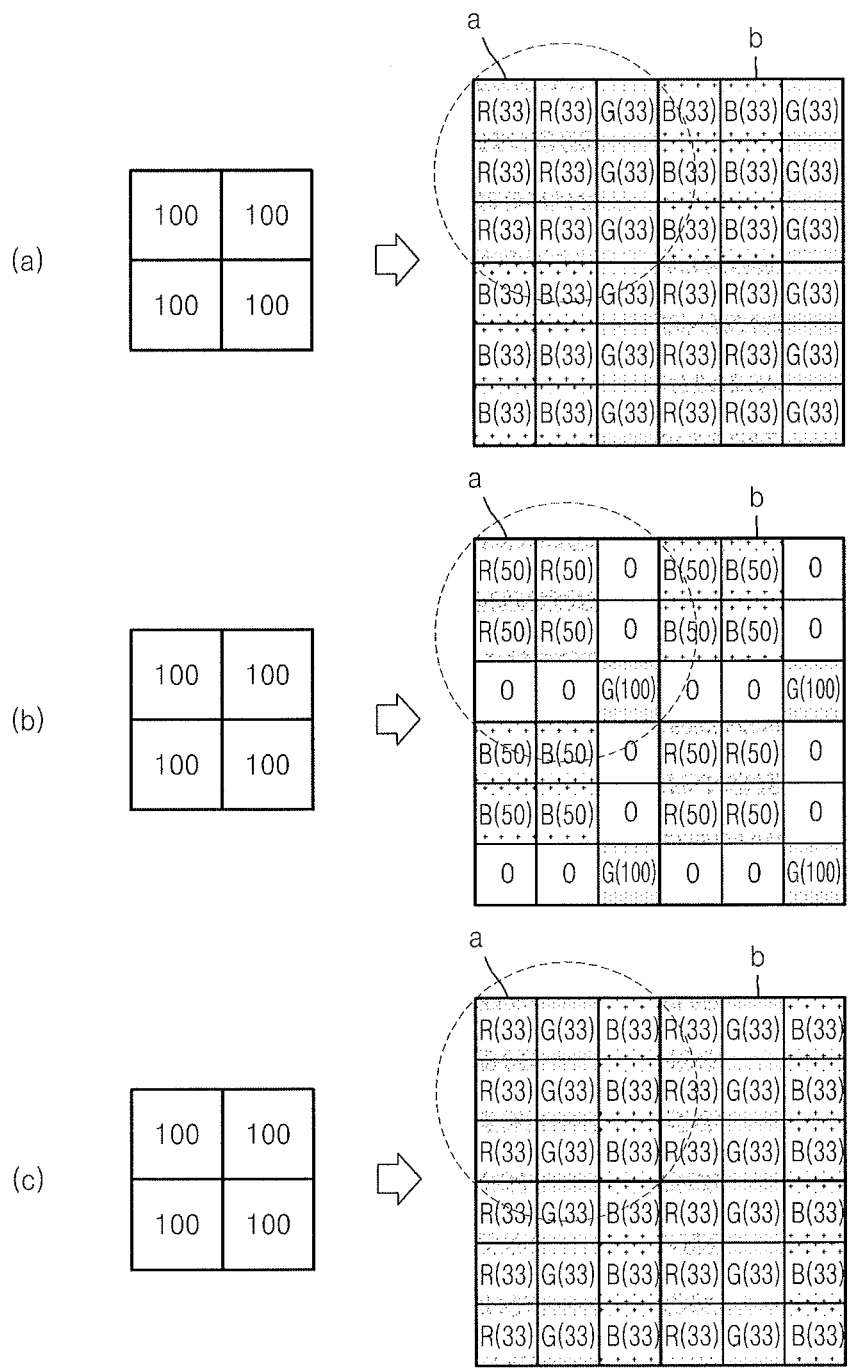
FIG. 10 is a set of diagrams of a method of establishing a target sub-pixel structure in a 3×3 pattern, according to an embodiments.

FIG. 10 is a set of diagrams for describing a method of establishing a target sub-pixel structure in a 3×3 pattern, according to an embodiment. The 3×3 pattern indicates one pixel having the target sub-pixel structure by using nine pixels having a RGB stripe sub-pixel structure. A square formed by a bold outline defines one pixel having the target sub-pixel structure. A single pixel defined by the thin outline includes three sub-pixels, i.e., the red sub-pixel R, the green sub-pixel G, and the blue sub-pixel B, and displays one color by lighting up only one sub-pixel from the three sub-pixels. Thus, the 3×3 pattern indicates one pixel having the target sub-pixel structure by using the nine pixels having an RGB stripe sub-pixel structure.

Here, when the brightness of white color is indicated by 100, a number in the square refers to the brightness of a sub-pixel. In addition, the number is a value obtained by setting a gamma value matched with panel properties and gamma-correcting image data to correct brightness.

FIG. 10(a) shows an example of a method of pseudo displaying white color in a 3×3 pattern by establishing a target sub-pixel pixel structure as the pentile sub-pixel structure shown in FIG. 3.

Referring to FIG. 10(a), the target sub-pixel structure is established by combining the first pseudo pixel "a" including six pixels in which the red sub-pixel R is lit up and three pixels in which the green sub-pixel G is lit up, and the second pseudo pixel "b" including six pixels in which the blue sub-pixel B is lit up and three pixels in which the green sub-pixel G is lit up. The brightness of each of the red sub-pixel R, the green sub-pixel G, and the blue sub-pixel B, which are used to display white color (of which the brightness is 100), is 33.

FIG. 10(b) shows an example of a method of pseudo displaying white color in a 3×3 pattern by establishing a target sub-pixel structure as the pentile sub-pixel structure shown in FIG. 4.

Referring to FIG. 10(b), the target sub-pixel structure is established by combining the first pseudo pixel "a" including four pixels in which the red sub-pixel R is lit up and one pixel in which the green sub-pixel G is lit up, and the second pseudo pixel "b" including four pixels in which the blue sub-pixel B is lit up and one pixel in which the green sub-pixel G is lit up. In the first pseudo pixel "a", the four pixels in which the red sub-pixel R is lit up and one pixel in which the green sub-pixel G is lit up diagonally face each other, i.e., the green sub-pixel G is arranged diagonally with respect to a bottom right red sub-pixel R of the four red sub-pixels R. In the second pseudo pixel "b", the four pixels in which the blue sub-pixel B is lit up and one pixel in which the green sub-pixel G is lit up diagonally face each other. The brightness of each of the red sub-pixel R and the blue sub-pixel B, which are used to display white color (of which the brightness is 100) is 50, and the brightness of the green sub-pixel G is 100. The brightness of the other pixels is 0.

FIG. 10(c) shows an example of a method of displaying white color in a 3×3 pattern in a RGB stripe pixel structure.

Referring to FIG. 10(c), three pixels in which the red sub-pixel R is lit up, three pixels in which the green sub-pixel G is lit up, and three pixels in which the blue sub-pixel B is lit up display colors, respectively. The brightness of each of the red sub-pixels R, the green sub-pixels G, and the blue sub-pixels B, which are used to display white color (of which the brightness is 100), is 33.

Figure 11:
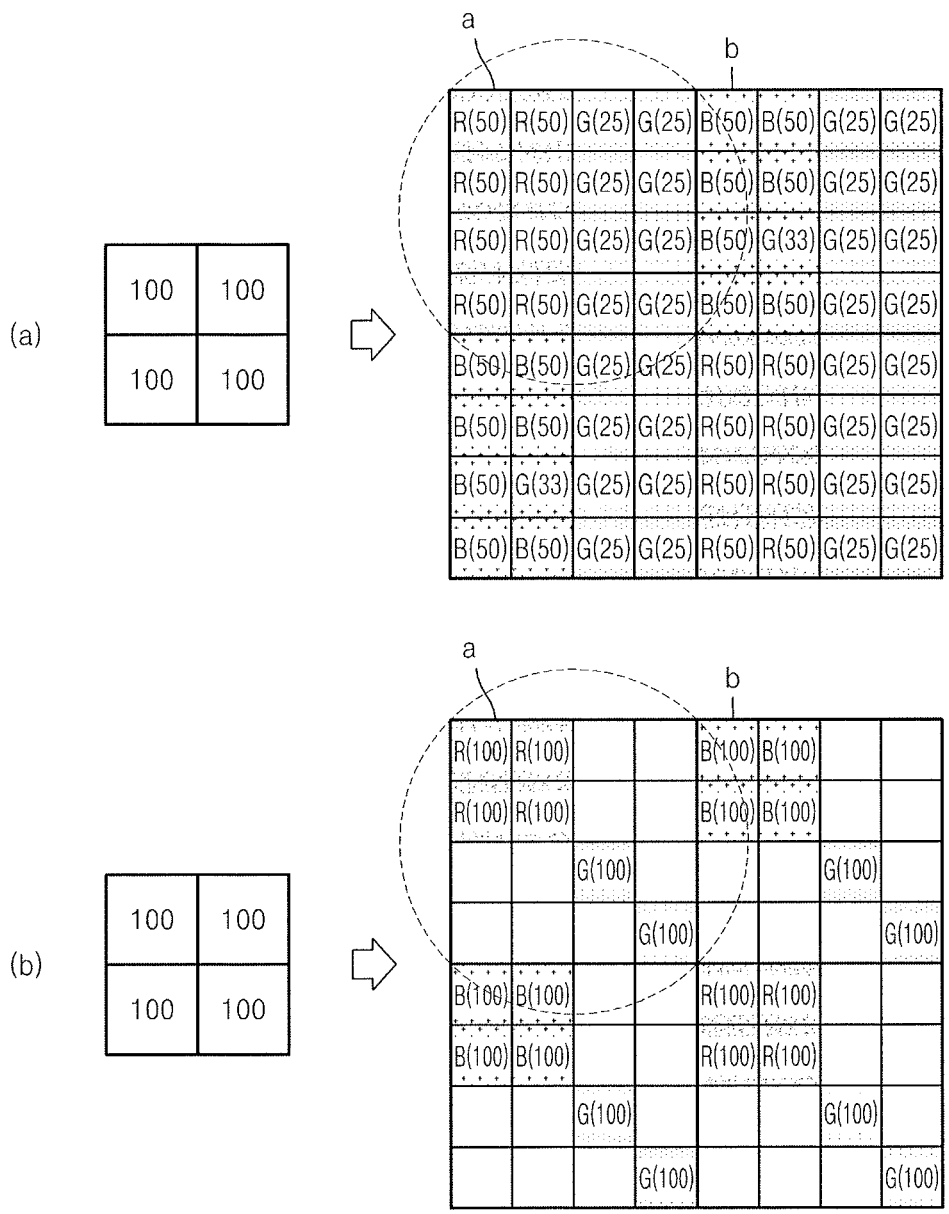
FIG. 11 is a set of diagrams of a method of establishing a target sub-pixel structure in a 4×4 pattern, according to an embodiment.

FIG. 11 is a set of diagrams for describing a method of establishing a target sub-pixel structure in a 4×4 pattern, according to an embodiment.

The 4×4 pattern indicates one pixel having the target sub-pixel structure by using 16 pixels having a RGB stripe sub-pixel structure. A square formed by a bold outline defines one pixel having the target sub-pixel structure. A single pixel defined by the thin outline includes three sub-pixels, i.e., the red sub-pixel R, the green sub-pixel G, and the blue sub-pixel B, and displays one color by lighting up only one sub-pixel of the three sub-pixels. Thus, the 4×4 pattern indicates one pixel having the target sub-pixel structure by using 16 pixels having a RGB stripe sub-pixel structure.

Here, when the brightness of white color is indicated by 100, a number in the square refers to the brightness of a sub-pixel. In addition, the number is a value obtained by setting a gamma value matched with panel properties and gamma-correcting image data to correct brightness.

FIG. 11(a) shows an example of a method of pseudo displaying white color in a 4×4 pattern by establishing a target sub-pixel structure as the pentile sub-pixel structure shown in FIG. 3.

Referring to FIG. 11(a), the target sub-pixel structure is established by combining the first pseudo pixel "a" including eight pixels in which the red sub-pixel R is lit up and eight pixels in which the green sub-pixel G is lit up, and the second pseudo pixel "b" including eight pixels in which the blue sub-pixel B is lit up and eight pixels in which the green sub-pixel G is lit up. The brightness of each of the red sub-pixel R and the blue sub-pixel B, which are used to display white color (of which the brightness is 100) is 50, and the brightness of the green sub-pixel G is 25.

FIG. 11(b) shows an example of a method of pseudo displaying white color in a 4×4 pattern by establishing a target sub-pixel structure as the pentile sub-pixel structure shown in FIG. 4.

Referring to FIG. 11(b), the target sub-pixel structure is established by combining the first pseudo pixel "a" including four pixels in which the red sub-pixel R is lit up and two pixels in which the green sub-pixel G is lit up, and the second pseudo pixel "b" including four pixels in which the blue sub-pixel B is lit up and two pixels in which the green sub-pixel G is lit up.

In the first pseudo pixel "a", the four pixels in which the red sub-pixel R is lit up and the two pixels in which the green sub-pixel G is lit up diagonally face each other, i.e., are arranged diagonally. In addition, the two pixels in which the green sub-pixel G is lit up face each other diagonally from top left to bottom right in the square outline. In the second pseudo pixel "b", the four pixels in which the blue sub-pixel B is lit up and the two pixels in which the green sub-pixel G is lit up diagonally face each other. In addition, the two pixels in which the green sub-pixel G is lit up face each other diagonally from bottom left to top right in the square outline. The brightness of each of the red sub-pixel R and the blue sub-pixel B, which are used to display white color (of which the brightness is 100), is 100 and the brightness of the green sub-pixels G is 100.

Figure 12:
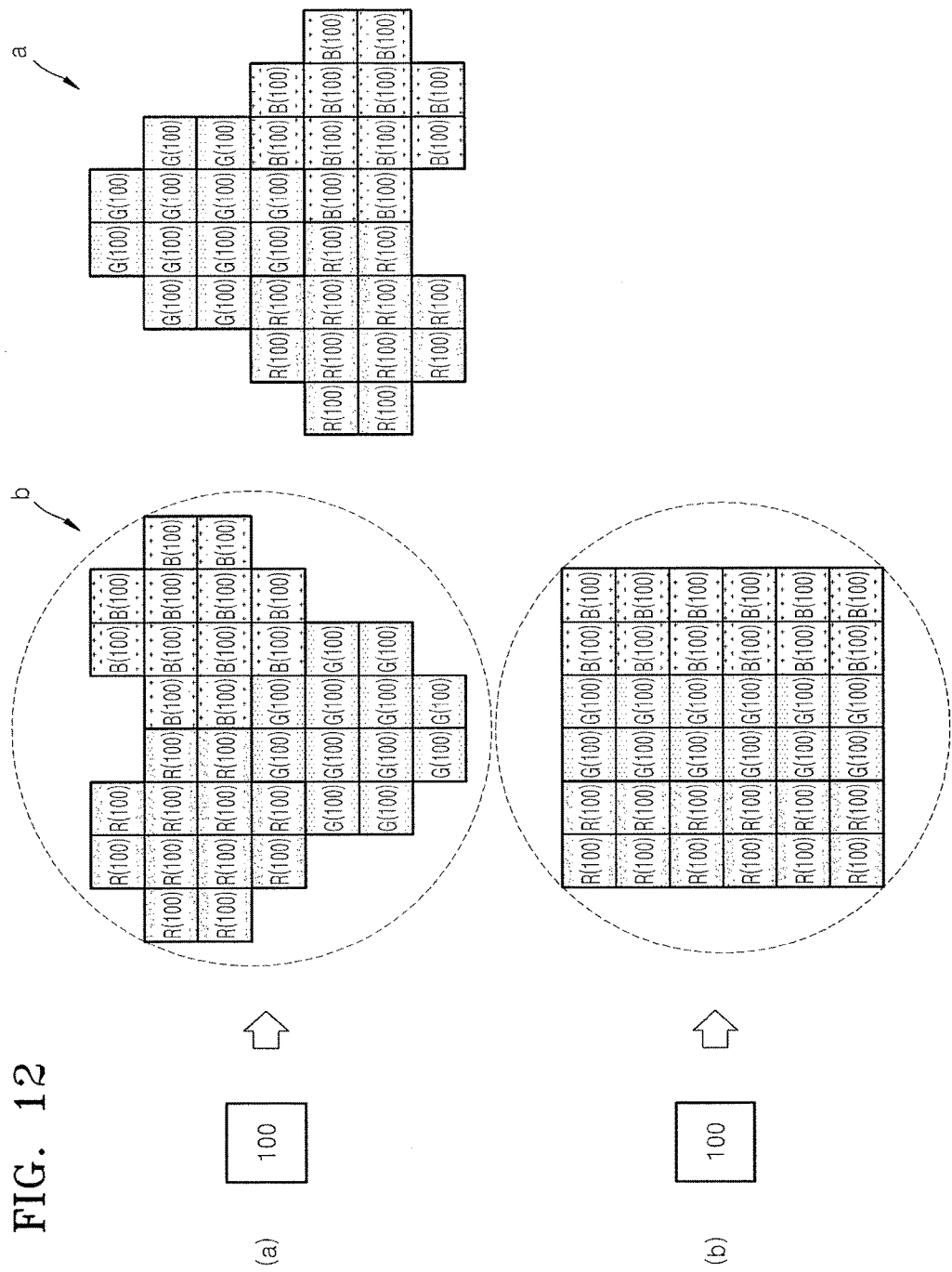
FIG. 12 is a set of diagrams of a method of establishing a target sub-pixel structure in a 6×6 pattern, according to an embodiment.

FIG. 12 is a set of diagrams for describing a method of establishing a target sub-pixel structure in a 6×6 pattern, according to an embodiment.

The 6×6 pattern indicates one pixel having the target sub-pixel structure by using 36 pixels having a RGB stripe sub-pixel structure. A square formed by a bold outline defines one pixel having the target sub-pixel structure. A single pixel defined by the thin outline includes three sub-pixels, that is, the red sub-pixel R, the green sub-pixel G, and the blue sub-pixel B, and displays one color by lighting up only one sub-pixel of the three sub-pixels. Thus, the 6×6 pattern indicates one pixel having the target sub-pixel structure by using the 36 pixels having a RGB stripe sub-pixel structure.

Here, when the brightness of white color is indicated by 100, a number in the square refers to the brightness of a sub-pixel. In addition, the number is a value obtained by setting a gamma value matched with panel properties and gamma-correcting image data to correct brightness.

FIG. 12(a) shows an example of a method of pseudo displaying white color in a 6×6 pattern by establishing a target sub-pixel structure as the hexagon sub-pixel structure shown in FIG. 5.

Referring to FIG. 12(a), the target sub-pixel structure is established by combining the first pseudo pixel "a" that includes the first pseudo pixel a including 12 pixels in which the red sub-pixel R is lit up, 12 pixels in which the green sub-pixels G is lit up, and 12 pixels in which the blue sub-pixel B is lit up, and displays RGB in a triangular form, and the second pseudo pixel b that includes 12 pixels in which the red sub-pixel R is lit up, 12 pixels in which the green sub-pixel G is lit up, and 12 pixels in which the blue sub-pixel B is lit up, and displays RGB in an inverted triangular form. 12 pixels indicating one color are arranged in a '+' shape. The brightness of each of the red sub-pixel R, the green sub-pixel G, and the blue sub-pixel B, which are used to display white color (of which the brightness is 100), is 100.

FIG. 12(b) shows an example of a method of displaying white color in a 6×6 pattern in an RGB stripe pixel structure.

Referring to FIG. 12(b), 12 pixels in which the red sub-pixel R is lit up, 12 pixels in which the green sub-pixel G is lit up, and 12 pixels in which the blue sub-pixel B is lit up display colors, respectively. The brightness of each of the red sub-pixels R, the green sub-pixels G, and the blue sub-pixels B, which are used to display white color (of which the brightness is 100), is 100.

Figure 13:
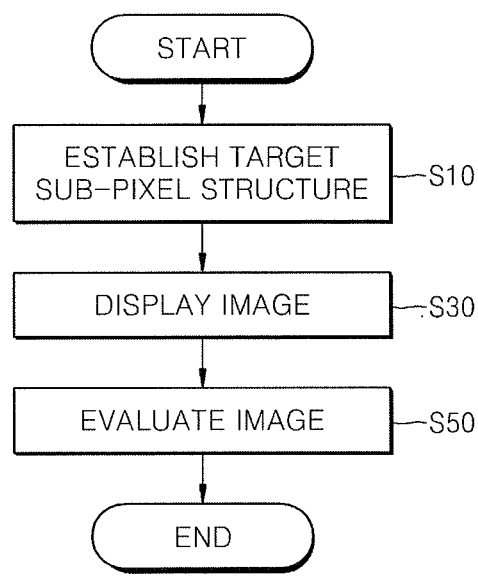
FIG. 13 is a flowchart of a method of evaluating the visibility of a plurality of sub-pixel structures, according to an embodiment.

FIG. 13 is a flowchart of a method of evaluating the visibility of a plurality of sub-pixel structures, according to an embodiment.

Referring to FIG. 13, a display apparatus establishes a target sub-pixel structure that is different from a stripe sub-pixel structure of a panel by combining a plurality of pixels in the panel having the stripe sub-pixel structure in which red sub-pixels, green sub-pixels, and blue sub-pixels are arranged in stripes (S10). Here, a pixel includes a red sub-pixel, a green sub-pixel, and a blue sub-pixel. Thus, the target sub-pixel structure may be established using a sub-pixel structure different than a stripe sub-pixel structure, e.g., as shown in FIGS. 3 through 5, and multiple sub-pixel structures may be combined to create the target sub-pixel structure, e.g., as illustrated in FIGS. 8-12. Since the stripe sub-pixel structure is established by using pixels whose number is equal to the number of pixels used to establish the target sub-pixel structure, the stripe sub-pixel structure and the target sub-pixel structure may be compared with each other in terms of visibility.

The display apparatus displays an image by using a set target sub-pixel structure (S30).

The display apparatus evaluates the displayed image (S50). The display apparatus may display various figures and characters and may evaluate the visibility of the image. The display apparatus may compare images that are pseudo displayed for respective sub-pixel structures with each other. Accordingly, the display apparatus may evaluate the visibility of the images prior to manufacturing a panel and may reflect the visibility in the development of products. Visibility may be evaluated based on, for example, a hue value, a saturation value, an intensity value, and so on of various figures and characters.

According to the one or more embodiments, various sub-pixel structures may be pseudo displayed by using a display apparatus having a RGB stripe sub-pixel structure, e.g., multiple sub-pixels of the RGB stripe sub-pixel structure may be arranged to define one pseudo sub-pixel in order to define a target sub-pixel structure within the RGB stripe sub-pixel structure. Thus, the visibility of each sub-pixel structure may be checked and evaluated via the target sub-pixel structure without manufacturing an actual module. That is, an image is pseudo displayed by using various new sub-pixel structures in a panel having a RGB stripe sub-pixel structure, and thus, the visibility of each sub-pixel structure may be evaluated without manufacturing a display apparatus having each sub-pixel structure, thereby reducing manufacturing cost and time. In addition, an effect of a rendering filter of each sub-pixel structure may be confirmed.

While the example embodiments have been particularly shown and described, it will be understood by those of ordinary skill in the art that various changes in form and details may be made therein without departing from the spirit and scope of the example embodiments as defined by the following claims.

What is claimed is:

1. A method of evaluating visibility in a panel of a stripe sub-pixel structure, the panel having a plurality of pixels, and each pixel comprising a red sub-pixel a green sub-pixel, and a blue sub-pixel, the method comprising:

establishing a non-stripe target sub-pixel structure different from the stripe sub-pixel structure of the panel by combining N×N (where N is a natural number) pixels of the plurality of pixels in the stripe sub-pixel structure;

displaying a pseudo image by controlling emission and non-emission states and a brightness of the red subpixel, green sub-pixel, and blue sub-pixel of each of the N×N pixels for the non-stripe target sub-pixel structure; and evaluating the displayed pseudo image based on the non-stripe target sub-pixel structure, wherein each of the N×N pixels displays color by emitting light from one subpixel among the red sub-pixel, the green sub-pixel, or the blue sub-pixel.

2. The method of claim 1, wherein the non-stripe target sub-pixel structure includes:
a first pseudo pixel having two first pixels and two second pixels, wherein a red sub-pixel of each first pixel having a red sub-pixel lit up emits light, and a green sub-pixel of each second pixel having a green sub-pixel lit up emits light; and
a second pseudo pixel having two third pixels and two fourth pixels, wherein a blue sub-pixel of each third pixel having a blue sub-pixel lit up emits light, and a green sub-pixel of each fourth pixel having a green sub-pixel lit up emits light, and wherein the first pseudo pixel and the second pseudo pixel alternately arranged in horizontal and vertical directions.

3. The method of claim 1, wherein the non-stripe target sub-pixel structure includes:
a first pseudo pixel having one first pixel and one second pixel arranged diagonally with respect to the first pixel, wherein a red sub-pixel of the first pixel having a red sub-pixel lit up emits light, and a green sub-pixel of the second pixel emits light; and
a second pseudo pixel having one third pixel and one second fourth pixel arranged diagonally, wherein a blue sub-pixel of the third pixel having a blue sub-pixel lit up emits light, and a green sub-pixel of the second fourth pixel having a green sub-pixel emits light, and wherein the first pseudo pixel and the second pseudo pixel are alternately arranged in horizontal and vertical directions.

4. The method of claim 1, wherein the non-stripe target sub-pixel structure includes:
a first pseudo pixel having six first pixels and three second pixels, wherein a red sub-pixel of each first pixel having a red sub-pixel lit emits light, and a green sub-pixel of each second pixel having a green sub-pixel lit emits light; and
a second pseudo pixel having six third pixels and three fourth pixels, wherein a blue sub-pixel of each third pixel having a blue sub-pixel lit up emits light, and a green sub-pixel of each fourth pixel having a green sub-pixel lit up emits light, and wherein the first pseudo pixel and the second pseudo pixel are alternately arranged in horizontal and vertical directions.

5. The method of claim 1, wherein the non-stripe target sub-pixel structure includes:
a first pseudo pixel having four first pixels and one second pixel arranged diagonally with respect to each of the four first pixels, wherein a red sub-pixel of the first pixel having a red sub-pixel lit up emits light, and a green sub-pixel of the second pixel having a green sub-pixel lit up emits light; and
a second pseudo pixel having four third pixels and one fourth pixel arranged diagonally with respect to each of the four third pixels, wherein a blue sub-pixel of each third pixel having a blue sub-pixel lit up emits light, and a green sub-pixel of the fourth pixel emits light, and wherein the first pseudo pixel and the second pseudo pixel are alternately arranged in horizontal and vertical directions.

6. The method of claim 1, wherein the non-stripe target sub-pixel structure includes:
a first pseudo pixel having eight first pixels and eight second pixels, wherein a red sub-pixel of each first pixel having a red sub-pixel lit emits light, and a green sub-pixel of each second pixel having a green sub-pixel lit emits light; and
a second pseudo pixel having eight third pixels and eight second fourth pixels, wherein a blue sub-pixel of each third pixel having a blue sub-pixel lit up emits light, and a green sub-pixel of each fourth pixel having a green sub-pixel lit up emits light, and wherein the first pseudo pixel and the second pseudo pixel alternately arranged in horizontal and vertical directions.

7. The method of claim 1, wherein the non-stripe target sub-pixel structure includes:
a first pseudo pixel having four first pixels and two second pixels arranged diagonally with respect to each of the four first pixels, wherein a red sub-pixel of the first pixel having a red sub-pixel lit up emits light, and a green sub-pixel of the second pixel having a green sub-pixel lit up emits light, and wherein the two second pixels are diagonally adjacent to each other; and
a second pseudo pixel having four third pixels and two fourth pixels arranged diagonally with respect to each of the four third pixels, wherein a blue sub-pixel of each third pixel emits light, and a green sub-pixel of the fourth pixel emits light, and wherein the two second pixels are diagonally adjacent to each other.

8. The method of claim 1, wherein the non-stripe target sub-pixel structure includes:
a first pseudo pixel including twelve first pixels, twelve second pixels and twelve third pixels, a red sub-pixel of each first pixel emits light, a green sub-pixel of each second pixel emits light, and a blue sub-pixel of each third pixel emits light, wherein a group of the twelve first pixels, a group of the twelve second pixels and a group of the twelve third pixels are arranged in a triangular structure; and
a second pseudo pixel having an inverted triangular structure relative to the first pseudo pixel.

9. The method of claim 1, wherein the brightness is obtained by gamma-correcting image data using a gamma value matched with panel properties.

10. A display apparatus, comprising:
a panel to display an image, the panel including a stripe sub-pixel structure having a plurality of pixels, wherein each pixel includes a red sub-pixel, a green sub-pixel, and a blue sub-pixel;
a pixel establisher to establish a non-stripe target sub-pixel structure different from the stripe sub-pixel structure of the panel by combining N×N (where N is a natural number) pixels of the plurality of pixels in the stripe sub-pixel structure; and
an evaluator to evaluate a pseudo image displayed in the panel based on the non-stripe target sub-pixel structure, wherein the pseudo image is displayed by controlling emission and non-emission states and a brightness of the red sub-pixel, the green sub-pixel and the blue sub-pixel of each of the N×N pixels for the non-stripe target sub-pixel structure, and wherein each of the N×N pixels displays color by emitting light from one sub-pixel among the red sub-pixel, the green sub-pixel, or the blue sub-pixel.

11. The display apparatus of claim 10, wherein the non-stripe target sub-pixel structure includes:

a first pseudo pixel having two first pixels and two second pixels, wherein a red sub-pixel of each first pixel emits light, and a green sub-pixel of each second pixel emits light; and a second pseudo pixel having two third pixels and two fourth pixels, wherein a blue sub-pixel of each third pixel emits light, and a green sub-pixel of each fourth pixel emits light, and wherein the first pseudo pixel and the second pseudo pixel alternately arranged in horizontal and vertical directions.

12. The display apparatus of claim 10, wherein the non-stripe target sub-pixel structure includes:

a first pseudo pixel having one first pixel and one second pixel arranged diagonally with respect to the first pixel, wherein a red sub-pixel of the first pixel emits light, and a green sub-pixel of the second pixel emits light; and a second pseudo pixel having one third pixel and one fourth pixel arranged diagonally, wherein a blue sub-pixel of the third pixel emits light, and a green sub-pixel of the fourth pixel emits light, and wherein the first pseudo pixel and the second pseudo pixel alternately arranged in horizontal and vertical directions.

13. The display apparatus of claim 10, wherein the non-stripe target sub-pixel structure includes:

a first pseudo pixel having six first pixels and three second pixels, wherein a red sub-pixel of each first pixel emits light, and a green sub-pixel of each second pixel emits light; and a second pseudo pixel having six third pixels and three fourth pixels, wherein a blue sub-pixel of each third pixel emits light, and a green sub-pixel of each fourth pixel emits light, and wherein the first pseudo pixel and the second pseudo pixel alternately arranged in horizontal and vertical directions.

14. The display apparatus of claim 10, wherein the non-stripe target sub-pixel structure includes:

a first pseudo pixel having four first pixels and one second pixel arranged diagonally with respect to each of the four first pixels, wherein a red sub-pixel of the first emits light, and a green sub-pixel of the second pixel emits light; and a second pseudo pixel having four third pixels and one fourth pixel arranged diagonally with respect to each of the four third pixels, wherein a blue sub-pixel of each third pixel emits light, and a green sub-pixel of the fourth emits light, and wherein the first pseudo pixel and the second pseudo pixel alternately arranged in horizontal and vertical directions.

15. The display apparatus of claim 10, wherein the non-stripe target sub-pixel structure includes:

a first pseudo pixel having eight first pixels and eight second pixels, wherein a red sub-pixel of each first pixel emits light, and a green sub-pixel of each second pixel emits light; and a second pseudo pixel having eight third pixels and eight fourth pixels, wherein a blue sub-pixel of each third pixel emits light, and a green sub-pixel of each fourth pixel emits light, and wherein the first pseudo pixel and the second pseudo pixel alternately arranged in horizontal and vertical directions.

16. The display apparatus of claim 10, wherein the non-stripe target sub-pixel structure includes:

a first pseudo pixel having four first pixels and two second pixels arranged diagonally with respect to each of the four first pixels, wherein a red sub-pixel of the first pixel emits light, and a green sub-pixel of the second pixel emits light, and wherein the two second pixels are diagonally adjacent to each other; and a second pseudo pixel having four third pixels and two fourth pixels arranged diagonally with respect to each of the four third pixels, wherein a blue sub-pixel of each third pixel emits light, and a green sub-pixel of the fourth pixel emits light, and wherein the two second pixels are diagonally adjacent to each other.

17. The display apparatus of claim 10, wherein the non-stripe target sub-pixel structure includes:

a first pseudo pixel including twelve first pixels, twelve second pixels and twelve third pixels, a red sub-pixel of each first pixel emits light, a green sub-pixel of each second pixel emits light, and a blue sub-pixel of each third pixel emits light, wherein a group of the twelve first pixels, a group of the twelve second pixels and a group of the twelve third pixels are arranged in a triangular structure; and a second pseudo pixel having an inverted triangular structure relative to the first pseudo pixel.

18. The display apparatus of claim 10, wherein the brightness is obtained by gamma-correcting image data using a gamma value matched with panel properties.

* * * * *